(12) United States Patent
Yakshin et al.

(10) Patent No.: US 8,025,777 B2
(45) Date of Patent: Sep. 27, 2011

(54) PROCESSES AND DEVICE FOR THE DEPOSITION OF FILMS ON SUBSTRATES (75) Inventors: Andrey E. Yakshin, Nieuwegein (NL); Wolfgang Fukarek, Fischbach. b. Arnsdorf i. S (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 224 days.

(21) Appl. No.: 12/399,887

(22) Filed: Mar. 6, 2009

(65) Prior Publication Data

US 2009/0223812 A1   Sep. 10, 2009

Related U.S. Application Data

(63) Continuation of application No. 10/754,151, filed on Jan. 9, 2004, now abandoned.

(51) Int. Cl.
C23C 14/34 (2006.01)
(52) U.S. Cl. ........................... 204/192.15; 430/5
(58) Field of Classification Search ............. 204/192.15; 430/5
See application file for complete search history.

(56) References Cited

U.S. PATENT DOCUMENTS

| 4,311,725 | A | 1/1982 | Holland |
| 4,957,604 | A | 9/1990 | Steininger |
| 5,431,794 | A | 7/1995 | Matsumaru et al. |
| 5,492,605 | A | 2/1996 | Pinarbasi |
| 5,643,633 | A | 7/1997 | Telford et al. |
| 5,709,958 | A | 1/1998 | Toyoda et al. |
| 5,938,897 | A | 8/1999 | Isao et al. |
| 6,077,403 | A | 6/2000 | Kobayashi et al. |
| H1933 | H | 1/2001 | Zabinski et al. |
| 6,190,511 | B1 | 2/2001 | Wei |
| 6,635,155 | B2 | 10/2003 | Miyamura et al. |
| 6,752,911 | B2 | 6/2004 | Jung |
| 6,878,241 | B2 | 4/2005 | Yamaguchi et al. |
| 6,893,542 | B1 | 5/2005 | Chen |
| 6,897,140 | B2 | 5/2005 | Drouin et al. |
| 2003/0024808 | A1 | 2/2003 | Donohue et al. |
| 2004/0052942 | A1 | 3/2004 | Bijkerk et al. |

FOREIGN PATENT DOCUMENTS

WO  02/48423 A2  6/2002

OTHER PUBLICATIONS

Gupta, S. et al.; M. Highly Uniform Dielectric Films Using a Combined Linear Scanning, Velocity Profiling, and Planetary Rotating Motion. Vacuum Technology & Coating[online], Dec. 2002[retrieved Apr. 17, 2007]. Retrieved from the Internet: URL:http://www.kdf.com/file_3.pdf.
P.J. Martin "Ion-Based Methods for Optical Thin Film Deposition", Journal of Material Science 21 (1986) pp. 1-25 entitled.

*Primary Examiner* — Rodney McDonald
(74) *Attorney, Agent, or Firm* — Sughrue Mion, PLLC

(57) ABSTRACT

It is in the object of the present invention to improve current deposition processes and devices for the fabrication of multilayer systems to better control the energy contribution at different stages of the deposition. This is achieved by depositing films by sputtering in a scheme providing for thermalized particles. One can get thermalized particles by choosing the working gas pressure and the distance between target and substrate to result in a mean free path of particles smaller than the distance between target and substrate or to result in a product of pressure and distance being larger than 2.0 cmPa.

4 Claims, 4 Drawing Sheets

PROCESSES AND DEVICE FOR THE DEPOSITION OF FILMS ON SUBSTRATES

This is a Continuation Application of U.S. application Ser. No. 10/754,151 filed Jan. 9, 2004 now abandoned, the contents of which are incorporated herein by reference.

BACKGROUND OF THE INVENTION

1. Field of the Invention

The present invention relates to processes for the deposition or etching of films on substrates, especially on the fabrication of multilayer systems.

The present invention also relates to devices for the deposition or etching of films on substrates, especially for the fabrication of multilayer systems in particular such devices comprising a substrate holder and at least one deposition source with target.

2. Description of the Related Art

Reflecting multilayer structures for the reflection of short wavelength electromagnetic rays are used e.g. in semiconductor lithography. They are used especially in the extreme ultraviolet and soft x-ray wavelength range. The extreme ultraviolet wavelength range (EUV) is the transition range between the ultraviolet and the soft x-ray range and generally comprises the wavelengths from approximately 16 nm to approximately 10 nm. The soft x-ray range generally comprises the wavelength from approximately 10 nm to 1 nm. For example, in EUV lithography wavelengths of approximately 13 nm are, in particular, used.

The simplest multilayer systems consist of alternating layers of two different materials, i.e. an absorbing and a reflecting material. More sophisticated multilayer systems can consist of more than two materials, the layer thickness and thickness ratios being constant or varying over the multilayer depth and/or plane. The principle of operation of multilayer systems is that the intensity of radiation which is reflected at different boundaries is increased by constructive interference if the layer period is made to match the wavelength of the incident radiation.

For the EUV range, mostly multilayer systems based on alternating layers of molybdenum and silicon are used. Theoretically, such systems can reflect up to 75% at near normal incidence of an incident wavelength of 13.5 nm. To the current state, practically achievable reflectivity using different deposition methods reaches 69.5 to 0.70.0% due to imperfections in layer manufacturing. The main limiting factors are the formation of interfacial roughness, intermixing of adjacent layers, contamination of layers, thickness errors and deviation of the density of deposited materials from bulk densities.

Mo/Si multilayers with a state-of-the-art performance have so far been fabricated by electron beam evaporation and magnetron sputtering.

Electron beam evaporation is a technique based on heating material in a crucible by a focused beam of high energy electrons. Electron beam evaporation features a low kinetic energy atomic flux (approximately 0.1 eV) and, especially when combined with ion assistance and/or post deposition polishing, it allows to selectively control the energy contribution at every stage of the film growth. Thus, the amount and the moment of applying additional energy to the layer system is controlled independently and allows selective optimization during the different stages of the layer growth. The particles have energies around $10^{-2}$-1 eV and only a small number of ions is produced in evaporant materials by electron bombardment.

Sputtering is a technique based on the ejection of target material by bombardment with energetic rare-gas ions, produced in a discharge or by a separate ion source. The gas used is also called working gas. The magnetron sputtering was developed in order to increase the sputter rate, where the magnetic field is used to trap electrons near the target surface, resulting in an increased ionization efficiency of the working gas (e.g. argon or krypton) and an increased amount of ionized particles bombarding the target. An essential feature of the sputter process is that it allows a particle flux of which the composition is identical to the target materials, i.e. compound materials like e.g. $B_4C$ are not dissociated in the creation of the particle flux, as is the case in most other deposition processes. Magnetron sputtering can thus be used for a wide range of materials and offers good control of the lateral profile of the films. In addition, magnetron sources exist in technical realizations that are compatible with the demands of ultrahigh vacuum systems.

To improve the quality of the deposited layer with respect to roughness and stability, the deposition can be ion assisted, i.e. the deposited layer is bombarded simultaneously with ions, or the layer surface can be etched by ion bombardment after deposition. For these methods, additional ion sources are used besides the physical sources supplied by e.g. electron evaporation or sputtering.

SUMMARY OF THE INVENTION

It is the object of the present invention to improve current deposition processes and devices to better control the energy contribution at different stages of the deposition.

This object is achieved by depositing films by sputtering, particularly magnetron sputtering in different operating schemes, in particular in a scheme providing for thermalized particles.

This object is achieved by a process for the deposition of films on substrates by sputtering, particularly magnetron sputtering, especially for the fabrication of multilayer systems, wherein at least at one deposition stage the mean free path of particles is chosen to be smaller than the distance between target and substrate by regulating the working gas pressure and/or the distance.

It is further achieved by a process for the deposition of films on substrates by sputtering, particularly magnetron sputtering, especially for the fabrication of multilayer systems, wherein at least at one deposition stage the working gas pressure and the distance between target and substrate are chosen to result in a product of pressure in Pa and distance in cm being larger than about 2.0 cmPa.

It is further achieved by processes for the deposition of films on substrates by electron beam deposition wherein one stage of deposition is done by sputtering, particularly magnetron sputtering in one of said schemes.

It is further achieved by a process of ion etching of surfaces wherein a magnetic field is applied to a sputtering source to direct working gas ions to a surface for etching.

It is further achieved by a device for the deposition of films on substrates, especially for the fabrication of multilayer systems, by magnetron sputtering, comprising a substrate holder, at least one magnetron with target, means for regulating the working gas pressure and means for regulating the distance between target and substrate holder.

It is further achieved by a device for the deposition of films on substrates, especially for the fabrication of multilayer systems, by magnetron sputtering, comprising a substrate holder and at least one magnetron with target, wherein the distance between substrate holder and target is about 25 cm or more It is further achieved by an etching device comprising a magnetizing unit for directing ions to a surface to be etched.

DETAILED DESCRIPTION OF THE INVENTION

One essential feature of the invention is a substantial reduction of the average energy of the particles to be deposited as compared to existing magnetron or ion sputter techniques.

Operating a sputtering device in abovementioned special schemes leads to a combination of crucial characteristics of electron beam evaporation on the one hand and sputtering, particularly magnetron sputtering on the other hand. Especially by regulating the working gas pressure and/or the distance between target and substrate in a way to obtain a mean free path of the particles smaller than the distance between target and substrate or by choosing the working gas pressure and the distance between target and substrate in a way to obtain a product of pressure and distance being larger than about 2.0 cmPa, one gets so called thermalized particles, i.e. particles with a very low kinetic energy. Thermalized particles have an energy in the range of about 0.01 to 10 eV, with a majority of particles being around 0.1-1 eV.

Generally, the mean free path varies depending on what working gas and what sputter material is used. Important parameters are the particle diameter and the particle energy: The smaller the particle and the higher the energy, the larger the mean free path. Preferably, inert gases are used as working gas. In a preferred embodiment krypton is used as working gas with krypton atoms and ions having energy up to several hundreds of electron volts. These particles can be used to thermalize the particles to be deposited by keeping the product of working gas pressure and distance between the target and substrate is larger than about 2.0 cmPa.

Using thermalized particles leads to better control of interdiffusion zones during deposition. Because of low kinetic energy the thermalized particles adhere on the surface of the substrate or the growing thin film without disturbing the order of the atoms thus avoiding mechanical intermixing.

Using thermalized particles it is easier to control the energy deposit by the particles on the surface, being normally an advantage of electron beam evaporation. The magnetron deposition allows a high precision lateral profile due to high stability flux and a larger size of the source of the atomic flux. The larger source size is advantageous for applying masking systems, for optimizing the lateral deposition profile or for applying masks moving during deposition.

In a preferred embodiment the process combines the use of thermalized particles in some stages of the deposition with the use of energetic particles in other deposition stages. This is done by regulating the working gas pressure and/or the distance between target and substrate in a way to obtain a mean free path of particles sometimes larger, sometimes smaller than the distance between target and substrate. Especially for the deposition of materials as used in the fabrication of reflective multilayer systems it is achieved by choosing the working gas pressure and the distance between target and substrate to result in a product of pressure and distance being sometimes larger and sometimes smaller than about 2.0 cmPa.

Best results have been achieved by starting the deposition of a new thin film with thermalized particles and then reducing the working pressure to allow the particles to reach the substrate with most of their initial energy. By starting deposition with thermalized particles the intermixing with the film below the subsequent film being deposited is efficiently suppressed. Multilayer systems made in this way show a higher reflectivity than multilayer systems made by conventional magnetron sputtering with only high energy particles.

The magnetron is a source of many different particles: sputtered atoms of the target material with energies around 1-10 eV that are deposited on the substrate to form a film or a layer on the one side and on the other side ions of the working gas and reflected neutralized ions that may have energies up to hundreds of eV, depending on the voltage used to maintain the discharge. These ions and reflected neutrals can reach the surface of the substrate and contribute to the energy input. The process can be further improved by operating the magnetron in an unbalanced mode for at least one deposition stage. By applying an additional magnetic field in front of the plasma the magnetic field lines extend to the substrate. Ions are then less tightly bound to the target region and can readily reach the substrate. The effects on the deposited film of operating in unbalanced mode may be compared to classical ion beam assisted deposition in that the ions increase the energy deposited in the deposited film and thus enhance the microscopic structure and the surface smoothness of the deposited film.

Another improvement yielding a higher deposition rate can be obtained by applying a bias voltage to the substrate to attract ions out of the plasma. The voltage can be gradually increased during growth to densify the film. Preferred voltages are in the range of a few tens of volts.

After the layer has been deposited, it can be polished to reduce surface roughness. This is preferably done with the help of ion beams. One may use additional ion sources as e.g. ion guns or plasma sources for polishing by ion bombardment (also called ion etching). Good results have been obtained by running the sputtering devices, particularly magnetrons in unbalanced mode, i.e. applying a magnetic field near the target and the plasma in a way that the magnetic field lines extend to the substrate surface and thus directing the ions to the surface, and at a lower discharge voltage, that leads to sputtering very little coating material from the target during this part of the process. The substrate should be biased to ca. −100 V to −1000 V or more with inert gas ions of the working gas bombarding the surface of the top layer and removing part of the deposited layer. This process and the respective device show not only the advantage of not needing an additional ion source as in current processes and devices for ion polishing or etching. They show the further advantage that matter source for sputtering and ion source for etching or polishing have the same geometric characteristics in view of the substrate surface. This allows a better control of the film or layer uniformity.

The described sputtering processes may be combined with electron beam deposition. Certain stages of thin film growth, especially when fabricating multilayers, can be done with electron beam evaporation, to benefit from high multilayer reflectivities achieved with e-beam deposition. Likewise, a deposition process based on electron beam evaporation can be combined with aforementioned sputtering or magnetron sputtering schemes leading to thermalized particles by doing-one stage of deposition by one of said sputtering or magnetron sputtering processes instead of electron beam evaporation. Especially, in the fabrication of multilayer systems, particularly reflective multilayer systems for extreme ultraviolet and soft x-ray wavelengths, combined processes are advantageous. Electron beam evaporation has the advantage of producing high quality films without intermixing with underlying layers. Sputtering, especially magnetron sputtering has the advantage to deposit target material with a specific stoichiometry without changing this stoichiometry by the sputter process—while not causing intermixing and being good for control of roughness if sputtered in one of aforementioned scheme leading to thermalized particles.

Especially for fabricating multilayer systems for the EUV range, it is advantageous to have distances between target and substrate larger than 25 cm.

Figure 1:
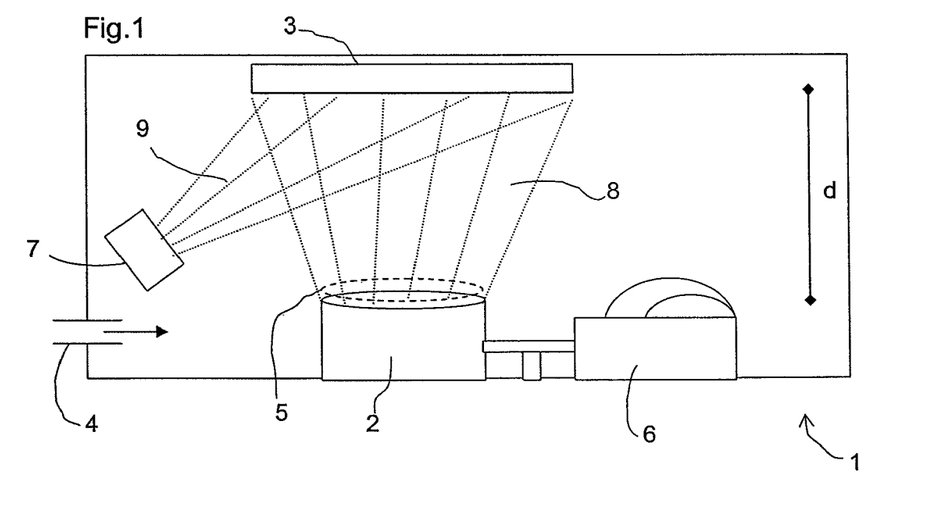
FIG. 1 shows a first device for the deposition of films by magnetron sputtering.

FIG. 1 shows schematically and exemplary an embodiment of a device 1 for the deposition of films on a substrate by magnetron sputtering for the fabrication of multilayer systems. It comprises a magnetron 2 with target and a substrate holder 3 with a mounted substrate. The distance d between substrate and target of the magnetron is fixed to be about 25 cm or more. By means of a variable valve 4 the pressure of the working gas can be regulated. When running the magnetron 2 with target a plasma 5 builds up above the target. By sputtering a flux 8 of particles is ejected from the target through the plasma in direction of the substrate mounted in the substrate holder 3. Additionally, an additional ion source 7, e.g. a second plasma source can be switched on to assist the deposition with an ion beam 9. It is possible to switch the magnetron 2 with target with an element 6 for electron beam evaporation for different stages of deposition. It is possible to switch between different magnetrons as well.

Figure 2:
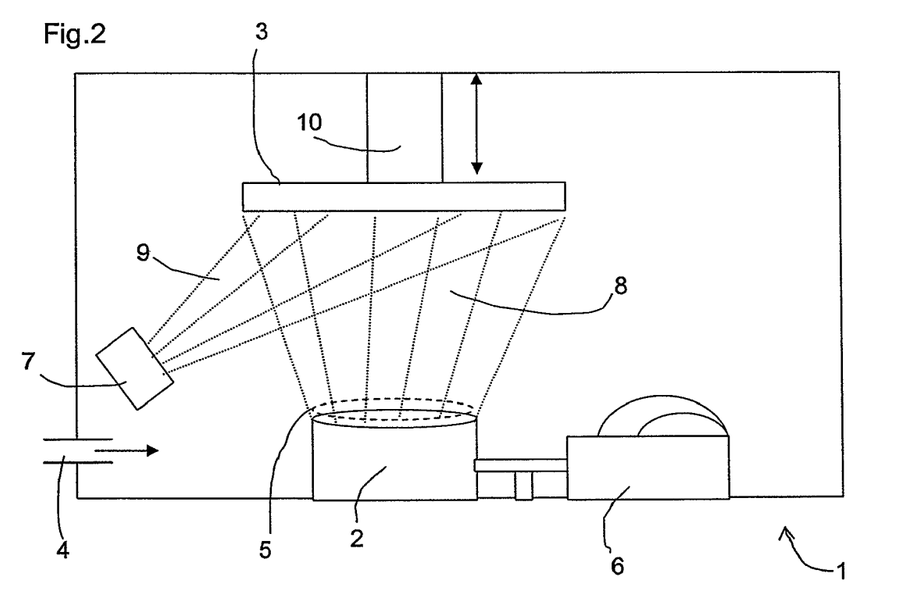
FIG. 2 shows a second device for the deposition of films by magnetron sputtering.

The device 1 shown in FIG. 2 is similar to that shown in FIG. 1 with the difference, that by means 10 the distance between substrate holder and substrate on the one side and target of the magnetron 2 can be adjusted during deposition process to operate the device 1 in different schemes as shown e.g. in the following examples.

Figure 3:
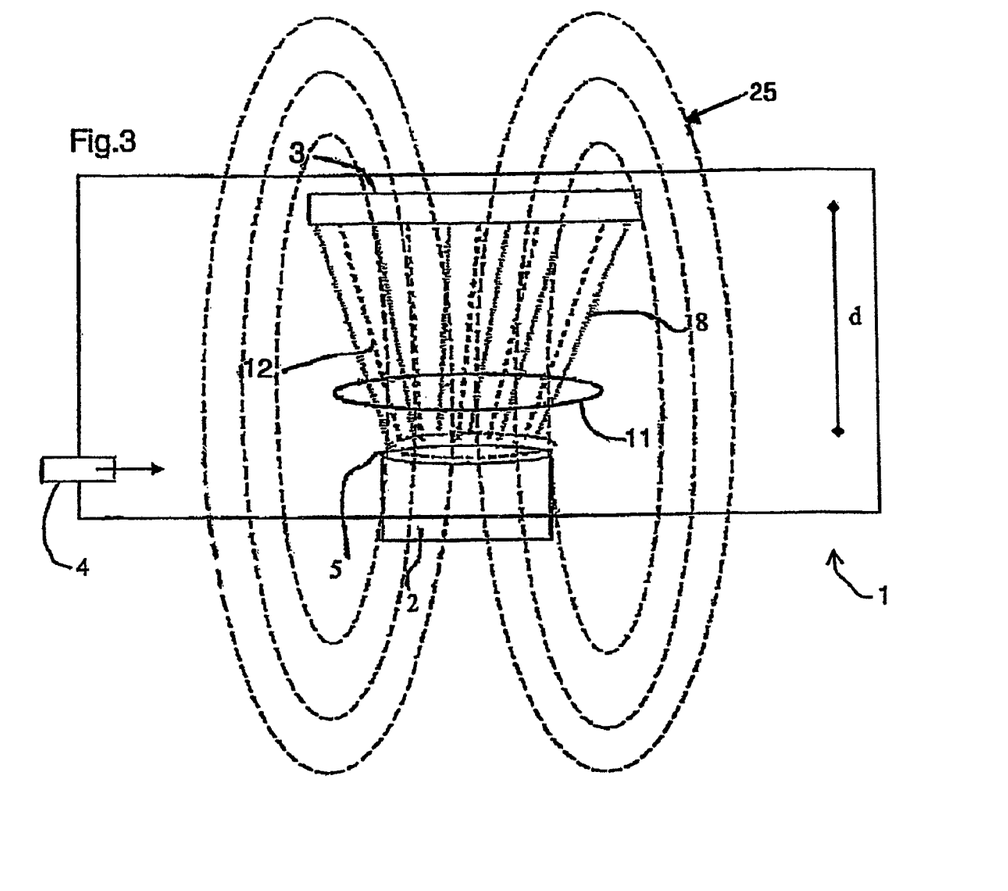
FIG. 3 shows a third device for the deposition of films by magnetron sputtering in unbalanced mode.

The device 1 shown in FIG. 3 has an additional magnetic unit 11 oriented in a way that the magnetic field lines 25 extend to the substrate mounted in the substrate holder 3 and direct a flux 12 of ions onto the substrate surface for ion beam assisted deposition or etching.

It is obvious to the person skilled in the art, that the schematic shown in FIGS. 1, 2 and 3 are the same for other sputtering devices as magnetron sputtering devices and that there need not to be additional ion sources or plasma sources 7 nor elements 6 for electron evaporation, if not needed for a specific deposition process. Schematics of e.g. planar diode sputtering and magnetron sputtering are shown in P. J. Martin, Journal of Material Science 21 (1986) 1-25 on p. 7, incorporated herein by reference.

Figure 4:
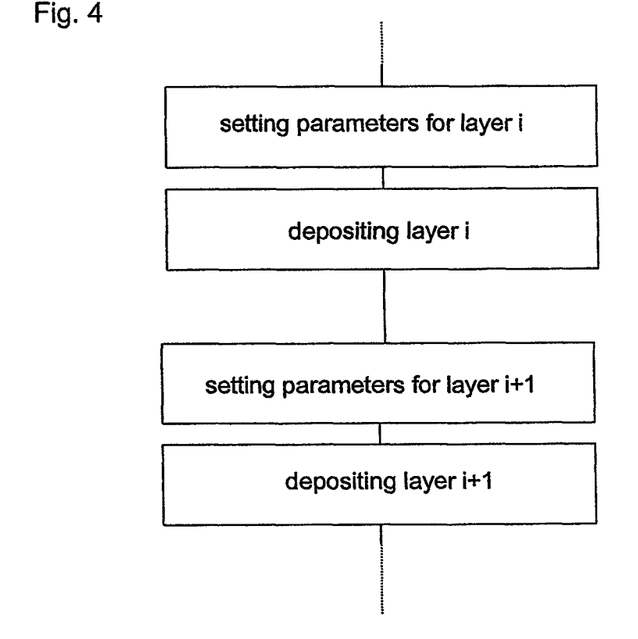
FIG. 4 shows a basic flowchart of the deposition process.

FIG. 4 shows the very basic principle of the deposition process as demonstrated in the following examples 1 to 5. For each layer i, i=1, 2, 3 . . . , the specific parameters have to be chosen before actually depositing the layer, such as the deposition method, e.g. sputtering, magnetron sputtering, electron beam evaporation; using thermalized particles or not; eventually using ion beam assisted deposition or using ion polishing; operating a magnetron in unbalanced mode or not; biasing the substrate or not and so forth. The deposition process in its different variations will be made clearer by the following examples.

EXAMPLE 1

A 50×[BL2/Si/BL1/Mo] multilayer is produced having a period of around 7.0 nm where Mo and Si are the basic materials of the multilayer, and BL1 and BL2 are thin barrier layers to protect the basic materials against interdiffusion. The materials of the barrier layers can be single elements or compounds. An electron gun with two targets will be used to deposit Si and Mo. They are set at a distance of about 100 cm from the substrate. Two magnetrons will be used for depositing material BL1 and BL2. They operate with Kr gas and are set at a distance of about 35 cm from the substrate during deposition. The magnetrons will operate in the balanced mode, i.e. the magnetic field lines are closed in the magnetron which confines most ionized particles close to the source. An ion source is used for polishing with krypton ions of 150 eV The substrate is moving from one deposition source to the other providing alternative exposures in front of every material target using the following individual schemes.

Deposition of Mo-layer: The layer is deposited by e-beam evaporation polishing. Pressure is the base pressure of the chamber ca. $2 \times 10^{-8}$ mbar. When the thickness of Mo layer reaches a predetermined value of around 1.5 nm, the substrate is moved to another target.

Deposition of BL1 interlayer: To avoid intermixing with the previous layer (Mo layer), what is a problem with conventional magnetron sputtering, the BL1-magnetron operates in the scheme providing thermalized particles. For this, the working gas pressure of Kr is set to ca. $7 \times 10^{-4}$ mbar. When the total thickness of material BL1 reaches a predetermined value of around 0.5 nm, which is about one monolayer of the material, the substrate is moved to another target.

Deposition of Si layer: The layer is deposited on the BL1 layer by e-beam evaporation. Pressure is the base pressure of the chamber, ca. $2 \times 10^{-8}$ mbar. When the thickness of Si layer reaches a predetermined value of around 5.0 nm, the deposition is stopped and ion beam is switched on to polish, i.e. smoothen the layer. During polishing about 0.5 nm of Si is removed to result in a Si film of a thickness of around 4.5 nm. Then the substrate is moved to another target.

Deposition of BL2 interlayer: To avoid intermixing with the previous layer (Si layer) the BL2-magnetron operates in the scheme providing thermalized particles. For this the working gas pressure of Kr is set to be ca. $7 \times 10^{-4}$ mbar. When the total thickness of material BL2 reaches a predetermined value of around 0.5 nm, which is about one monolayer of the material, the substrate is moved to the next target.

EXAMPLE 2

A 50×[BL2/Si/BL1/Mo] multilayer is produced having a period of around 7.0 nm where Mo and Si are the basic materials of the multilayer, and BL1 and BL2 are thin barrier layers to protect the basic materials against interdiffusion. The materials of the barrier layers can be single elements or compounds. Four magnetrons will be used for the following materials: molybdenum (Mo), material BL1 (BL1), silicon (Si), and material BL2 (BL2). They operate with Kr gas and are set at a distance of about 25 cm from the substrate during deposition of every material. All magnetrons operate in the balanced mode, i.e. magnetic field lines are closed in the magnetron which confines most ionized particles close to the source. The substrate is moving from one magnetron to the other providing alternative exposures in front of every material target using the following individual schemes.

Deposition of Mo-layer: To avoid intermixing with the previous layer at the beginning, the Mo-magnetron operates in the scheme providing thermalized particles. For this, the working gas pressure is set to ca. $8 \times 10^{-4}$ mbar. When the thickness of the film reaches around 0.5 nm, the energy of particles should be increased to enable control of the growing film's roughness. For that, working gas pressure is decreased to ca. $2\times10^{-4}$ mbar enabling energetic particles reach the substrate surface. When the total thickness of Mo reaches a predetermined value of around 1.5 nm, the substrate is moved to another target.

Deposition of BL1 interlayer: To avoid intermixing with the previous layer (Mo layer) the BL1-magnetron operates in the scheme providing thermalized particles. For this, the working gas pressure is set to ca. $8\times10^{-4}$ mbar. When the total thickness of material BL1 reaches a predetermined value of around 0.5 nm, the substrate is moved to another target.

Deposition of Si layer: To avoid intermixing with the previous layer (BL1 layer) at the beginning, the Si-magnetron operates in the scheme providing thermalized particles. For this, the working gas pressure is set to be ca. $8\times10^{-4}$ mbar. When the thickness of the film reaches around 0.5 nm, the energy of the particles should be increased to enable the control of the growing film's roughness. For that, the working gas pressure is decreased to ca. $2\times10^{-4}$ mbar enabling energetic particles to reach the substrate surface. When the total thickness of Si reaches a predetermined value of around 4.5 nm, the substrate is moved to another target.

Deposition of BL2 interlayer: To avoid intermixing with the previous layer (Si layer) the BL2-magnetron operates in the scheme providing thermalized particles. For this the working gas pressure is set to be ca. $8\times10^{-4}$ mbar. When the total thickness of material BL2 reaches a predetermined value of around 0.5 nm, the substrate is moved to another target.

EXAMPLE 3

A 50×[SiC/Si/Mo$_2$C/Mo] multilayer is produced having a period of around 7.0 nm where Mo and Si are the basic materials of the multilayer, and Mo$_2$C and SiC are compounds used as thin barrier layers to protect the basic materials against interdiffusion. Three magnetrons will be used with the following materials: molybdenum (Mo), carbon (C), and silicon (Si). Argon is used as working gas. All magnetrons operate in the balanced mode and are set at a distance of about 30 cm from the substrate during the deposition of every material. The substrate is moving from one magnetron to the other providing alternative exposures in front of every material target using the following individual schemes.

Deposition of Mo layer: To avoid intermixing with the previous layer at the beginning, the Mo-magnetron operates in the scheme providing thermalized particles. For this, the magnetron operates in the balanced mode, and the working gas pressure is set to ca. $8\times10^{-4}$ mbar. When the thickness of the film reaches around 0.5 nm, the energy of particles should be increased to enable control of the growing film's roughness. For that, the working gas pressure is decreased to ca. $3\times10^{-4}$ mbar enabling energetic particles to reach the substrate surface. When the total thickness of Mo reaches a predetermined value of around 1.5 nm, the substrate is moved to another target.

Deposition of Mo$_2$C interlayer: To form the Mo$_2$C compound, carbon will be deposited on top of Mo layer in the presence of energetic particles. The energy should be high enough to initiate diffusion of deposited carbon into molybdenum and form the necessary bindings. For this, the working gas pressure is set to ca. $3\times10^{-4}$ mbar enabling energetic particles to reach the surface of the growing film. When the total thickness of Mo$_2$C interlayer reaches a predetermined value of around 0.5 nm, the substrate is moved to another target.

Deposition of Si layer: To avoid intermixing with the previous layer (Mo$_2$C layer) at the beginning, the Si-magnetron operates in the scheme providing thermalized particles. For this, the working gas pressure is set to ca. $8\times10^{-4}$ mbar. When thickness of the film reaches around 0.5 nm, the energy of particles should be increased to enable control of the growing film's roughness. For that, the working gas pressure is decreased to ca. $3\times10^{-4}$ mbar enabling energetic particles to reach the surface of the growing film. When the total thickness of Si reaches a predetermined value of around 4.5 nm, the substrate is moved to another target.

Deposition of SiC interlayer: To form the SiC compound, carbon will be deposited on top of the Si layer in the presence of energetic particles. The energy should be high enough to initiate diffusion of deposited carbon into silicon and form the necessary bindings. For this, the working gas pressure is set to be ca. $3\times10^{-4}$ mbar enabling energetic particles reach the surface of the growing film. When the total thickness of Si—C interlayer reaches a predetermined value of around 0.5 nm, the substrate is moved to another target.

EXAMPLE 4

A 50×[SiC/Si/Mo$_2$C/Mo] multilayer is produced having a period of around 7.0 nm where Mo and Si are the basic materials of the multilayer, and Mo$_2$C and Si—C are compounds used as thin barrier layers to protect the basic materials against interdiffusion. Krypton is used as working gas. All magnetrons are set at a distance of about 40 cm from substrate during deposition of every material. The substrate is moving from one magnetron to the other providing alternative exposures in front of every material target using the following individual schemes.

Deposition of Mo layer: To avoid intermixing with the previous layer at the beginning, the Mo-magnetron operates in the scheme providing thermalized particles. For this, the magnetron operates in the balanced mode, and the working gas pressure is set to ca. $6\times10^{-4}$ mbar. When the thickness of the film reaches around 0.5 nm, the energy of particles should be increased to enable control of the growing film's roughness. For that, the magnetron is switched to unbalanced mode and a negative bias of about −100 eV is applied to the substrate. This provides additional bombardment of the growing film with ca. 100 eV ions. The working gas pressure is decreased to ca. 1×10−4 mbar enabling energetic particles to reach the surface of the growing film. When the total thickness of Mo reaches a predetermined value of around 1.5 nm, the substrate is moved to another target.

Deposition of Mo$_2$C interlayer: To form the Mo$_2$C compound, carbon will be deposited on top of the Mo layer in the presence of energetic particles. The energy and flux of the energetic particles should be high enough to initiate diffusion of deposited carbon into molybdenum and form the necessary bindings. For that, the magnetron is switched to unbalanced mode and a negative bias of ca. −100 V is applied to the substrate. The working gas pressure is set to ca. $1\times10^{-4}$ mbar enabling energetic particles to reach the surface of the growing film. When the total thickness of the Mo$_2$C interlayer reaches a predetermined value of around 0.5 nm the substrate is moved to another target.

Deposition of Si layer: To avoid intermixing with the previous layer (Mo$_2$C layer) at the beginning, the Si-magnetron operates in the scheme providing thermalized particles. For this, the magnetron operates in the balanced mode and the working gas pressure is set to ca. $6\times10^{-4}$ mbar. When thickness of the film reaches around 0.5 nm, the energy of particles should be increased to enable control of the growing film's roughness. For that, the magnetron is switched to unbalanced mode and a negative bias of about −100 V is applied to the substrate providing for ca. 100 eV ion bombardment of the surface during deposition. The working gas pressure is decreased to ca. $1\times10^{-4}$ mbar enabling particles to reach the surface of the growing film. When the total thickness of Si reaches a predetermined value of around 4.5 nm, the substrate is moved to another target.

Deposition of SiC interlayer: To form the SiC compound, carbon will be deposited on top of the Si layer in the presence of energetic particles. The energy and flux of energetic particles should be high enough to initiate diffusion of deposited carbon into silicon and form the necessary bindings. For that, the magnetron is switched to unbalanced mode and a negative bias of about –100 V is applied to the substrate. The working gas pressure is set to ca. $1\times10^{-4}$ mbar enabling particles to reach the surface of the growing film. When the total thickness of Si reaches a predetermined value of around 4.5 nm, the substrate is moved to another target.

EXAMPLE 5

A 50×[SiC/Si/Mo$_2$C/Mo] multilayer is produced having a period of around 7.0 nm where Mo and Si are the basic materials of the multilayer, and Mo$_2$C and SiC are compounds used as thin barrier layers to protect the basic materials against interdiffusion. Krypton is used as working gas. All magnetrons are set at a distance of about 35 cm from substrate during deposition of every material. The substrate is moving from one magnetron to the other providing alternative exposures in front of every material target using the following individual schemes.

Deposition of Mo layer: To avoid intermixing with the previous layer at the beginning, the Mo-magnetron operates in the scheme providing thermalized particles. For this, the magnetron operates in the balanced mode, and the working gas pressure is set to ca. $7\times10^{-4}$ mbar. When the thickness of the film reaches around 0.5 nm, the energy of particles should be increased to enable control of the growing film's roughness. For this, the working gas pressure is decreased to ca. $2\times10^{-4}$ mbar. In addition, an ion beam of about 100 eV ions from a supplemental plasma source is used. This provides additional bombardment of the growing film with about 100 eV ions. When the total thickness of Mo reaches a predetermined value of around 1.5 nm, the substrate is moved to another target.

Deposition of Mo$_2$C interlayer: To form the Mo$_2$C compound, carbon will be deposited on top of the Mo layer in the presence of energetic particles. The energy and flux of the energetic particles should be high enough to initiate diffusion of deposited carbon into molybdenum and form the necessary bindings. The working gas pressure is set to ca. $2\times10^{-4}$ mbar. In addition, an ion beam of ca. 100 eV ions from a supplemental plasma source is used. When the total thickness of Mo$_2$C interlayer reaches a predetermined value of around 0.5 nm the substrate is moved to another target.

Deposition of Si layer: To avoid intermixing with the previous layer (Mo$_2$C layer) at the beginning, the Si-magnetron operates in the scheme providing thermalized particles. For this, the magnetron operates in the balanced mode and the working gas pressure is set to ca. $7\times10^{-4}$ mbar. When the thickness of the film reaches around 0.5 nm, the particle energy should be increased to enable control of the growing film's roughness. For this, the working gas pressure is decreased to ca. $2\times10^{-4}$ mbar. In addition, an ion beam of ca. 50 eV ions from a supplemental plasma source is used. The working gas pressure is decreased to ca. $2\times10^{-4}$ mbar enabling energetic particles reach the surface of the growing film. When the total thickness of Si reaches a predetermined value of around 4.5 nm, the magnetron sputtering is stopped and the film is polished by the ion beam of ca. 150 eV form the second plasma source to minimize surface roughness. Afterwards the substrate is moved to another target.

Deposition of SiC interlayer: To form the SiC compound, carbon will be deposited on top of the Si layer in the presence of energetic particles. The energy and flux of energetic particles should be high enough to initiate diffusion of deposited carbon into silicon and form the necessary bindings. In addition, an ion beam of ca. 150 eV ions from a supplemental plasma source is used. The working gas pressure is set to ca. $2\times10^{-4}$ mbar. In addition, an ion beam of 100 eV ions from a supplemental plasma source is used. When the total thickness of the SiC interlayer reaches a predetermined value of around 0.5 nm, the substrate moved to another target.

Figure 5:
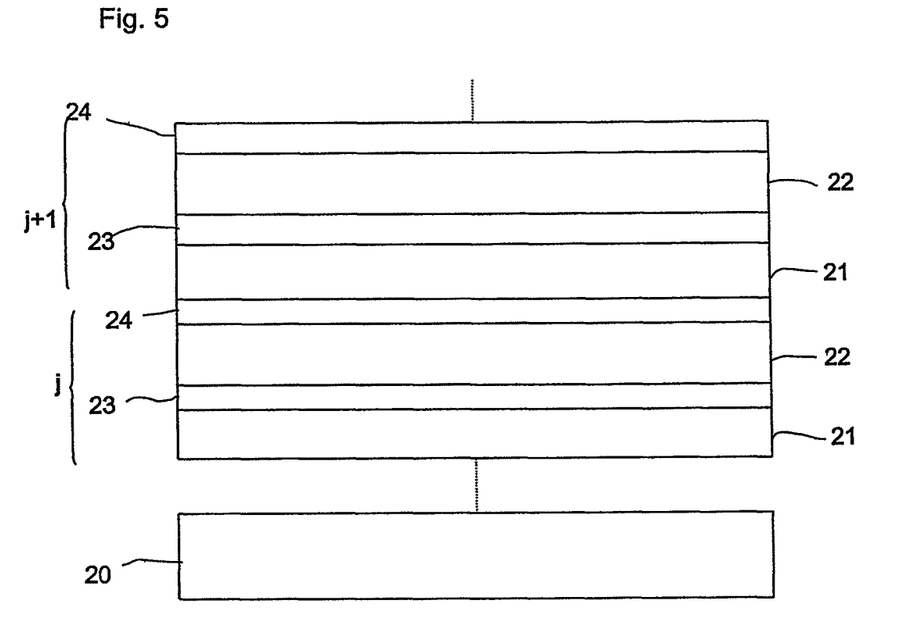
FIG. 5 shows a sketch of an optical device with multilayer system.

FIG. 5 shows the basic structure of an optical device to be used e.g. in the EUV or soft x-ray wavelength range. This optical device is produced e.g. according to the examples 1 to 5. On a substrate 20 periodic sets of layers are deposited. Each set j, j+1 etc. has four layers 21, 22, 23, 24, the layers 21 and 23 being the optically active absorbing and reflecting layers, e.g. Mo and Si for most EUV applications. The layers 22 and 24 in these specific examples are barrier layers. By preventing interdiffusion they enhance the actual reflectivity of the optical device.

The shown optical device is to be understood only as example. The actual design of the multilayer will be chosen depending on the working wavelength, the working environment and the application as is well known to the person skilled in the art.

Figure 6:
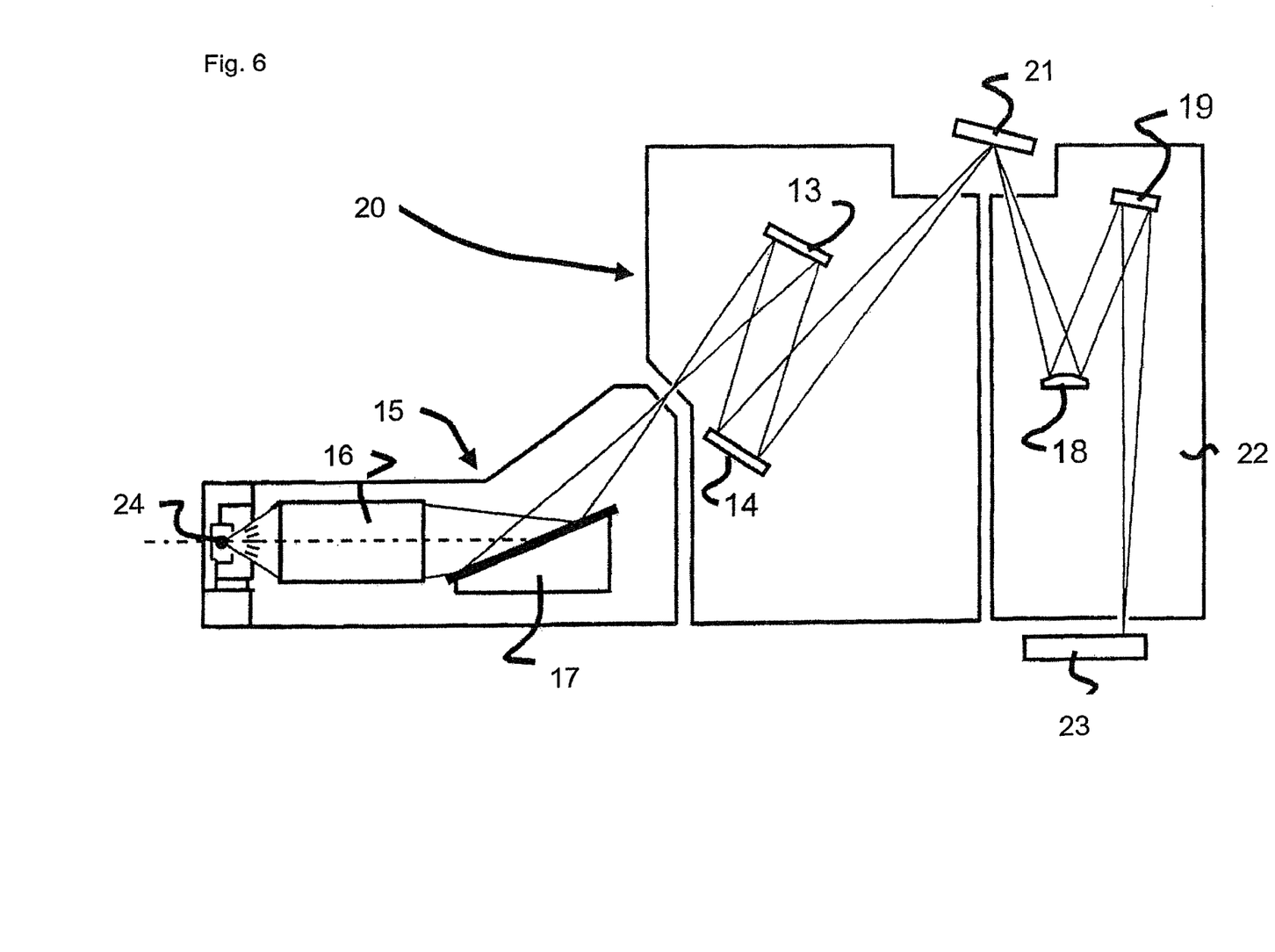
FIG. 6 shows a lithography apparatus.

One possible application of the optical device is EUV lithography. FIG. 6 shows a lithography apparatus with a part 15 to generate and EUV beam, an illumination system 20, a reticle 21 and a projection system 22 to project the structure of the reticle 21 on the wafer 23.

As light source 24 can be used e.g. mercury lamps or excimer laser. The light is collected by a collector 16 and conditioned for the illumination system IL by diffraction on grid 17. The illumination system 20 as well as the projection system 22 show two reflective optical devices 13, 14 and 18, 19. Each optical device 13, 14, 18, 19 as well as the reticle 21 is based on multilayer systems and may be produced as described in the text.

While particular embodiments, materials and parameters have been set forth or illustrated to exemplify and the principles of the invention, such are not intended to be limiting. Modifications and changes may become apparent to those skilled in the art, and it is intended that the invention be limited only by the scope of the appended claims.

What is claimed:

1. A process for the deposition of films on substrates, comprising:
   a step of sputtering or magnetron sputtering of one layer of Mo or Si on another layer underlying said one layer of Mo or Si or on a substrate for the fabrication of a reflective Mo/Si multilayer system for the extreme ultraviolet wavelength range, wherein a distance between a target and a substrate is larger than 25 cm, and
   wherein during said sputtering of said one layer a working gas pressure is regulated in a first step to a first pressure value and is decreased in one subsequent step to a second pressure value lower than the first pressure value,
   so that for the first pressure value the mean free path of particles is smaller than the distance between the target and the substrate and for the second pressure value the mean free path of particles is larger than the distance between the target and the substrate, leading to a suppression of intermixing between said one layer and said another layer or said substrate for the first pressure value and enabling to control the growing film's roughness of said one layer for the second pressure value.

2. A process as claimed in claim 1, wherein said one layer has a total thickness of about 1.5 nm for Mo and 4.5 nm for Si and wherein said first step of sputtering ends at a thickness of about 0.5 nm for Mo and 0.5 nm for Si.

3. A process as claimed in claim 1, wherein said first pressure value is set between about $6\times10^{-4}$ mbar and about $8\times10^{-4}$ mbar and said second pressure value is set between about $1\times10^{-4}$ mbar and about $3\times10^{-4}$ mbar.

4. A process as claimed in claim 2, wherein said first pressure value is set between about $6\times10^{-4}$ mbar and about $8\times10^{-4}$ mbar and said second pressure value is set between about $1\times10^{-4}$ mbar and about $3\times10^{-4}$ mbar.

* * * * *

UNITED STATES PATENT AND TRADEMARK OFFICE
CERTIFICATE OF CORRECTION

| | |
|---|---|
| PATENT NO. | : 8,025,777 B2 |
| APPLICATION NO. | : 12/399887 |
| DATED | : September 27, 2011 |
| INVENTOR(S) | : Andrey Yakshin and Wolfgang Fukarek |

It is certified that error appears in the above-identified patent and that said Letters Patent is hereby corrected as shown below:

Column 1, Line 47: delete "0.70.0%" and insert -- 70.0% --
Column 2, Line 67: delete "more" and insert -- more. --
Column 5, Line 1: delete "doing-" and insert -- doing --
Column 8, Line 43: delete "1×10-4" and insert -- $1 \times 10^{-4}$ --, therefor Signed and Sealed this
First Day of January, 2013

David J. Kappos
*Director of the United States Patent and Trademark Office*